United States Patent [19]

Sevastopoulos et al.

[11] Patent Number: 5,440,270
[45] Date of Patent: Aug. 8, 1995

[54] LINEAR-PHASE FILTER HAVING HIGH GAIN SELECTIVITY

[75] Inventors: Nello G. Sevastopoulos, San Jose; Philip T. Karantzalis, Fremont, both of Calif.

[73] Assignee: Linear Technology Corporation, Milpitas, Calif.

[21] Appl. No.: 914,205

[22] Filed: Jul. 14, 1992

[51] Int. Cl.$^6$ .......................... H03F 1/32; H03F 3/191
[52] U.S. Cl. ...................................... 330/107; 330/303
[58] Field of Search ................. 330/51, 107, 302, 303, 330/306

[56] References Cited

U.S. PATENT DOCUMENTS

| | | |
|---|---|---|
| 4,257,006 | 3/1981 | Schaumann ..................... 330/107 X |
| 4,417,214 | 11/1983 | Sevastopoulos et al. ............. 330/84 |
| 4,593,250 | 6/1986 | Lucas et al. .......................... 330/107 |

OTHER PUBLICATIONS

*Analog Filter Design*, by M. E. Van Valkenburg, Chapter 18: Delay Equalization, pp. 523–543; published by Halt, Rinehart & Winston; New York, 1982.

*Passive and Active Network Analysis and Synthesis*, by Aram Budak, pp. 448–455, 644–651 (Chapter 22); published by Houghton, Mifflin Co.; Boston, 1974.

*Primary Examiner*—Steven Mottola
*Attorney, Agent, or Firm*—Fish & Neave; Mark D. Rowland; Michael DeHaemer

[57] ABSTRACT

A switched capacitor lowpass filter is disclosed having four cascaded general purpose switched capacitor active filter blocks that combine with each other to produce a particular overall transfer function that has high gain selectivity and substantially linear phase response characteristics. The filter can also include a clock input which allows a user to select the cut-off frequency of the filter. The filter's characteristics are tailored in accordance with a method which: (1) introduces a notch frequency into the filter's gain characteristics, so as to improve the filter's gain selectivity near the cut-off frequency, and (2) linearizes the phase response characteristics of the overall filter, without modifying the magnitude of the gain of the notch-containing filter.

51 Claims, 9 Drawing Sheets

LINEAR-PHASE FILTER HAVING HIGH GAIN SELECTIVITY

BACKGROUND OF THE INVENTION

The present invention relates to a filter with improved frequency response characteristics. More particularly, the present invention relates to a filter having high gain selectivity and linear phase response characteristics.

The function of a low-pass filter is to pass low frequency analog signals (e.g., from dc to some specified cutoff frequency $f_c$) and to attenuate higher frequency signals. An ideal low-pass filter would exhibit a perfectly flat response in its passband (i.e., frequencies below $f_c$) and infinite attenuation in its stopband (i.e., frequencies above $f_c$), with a rapid transition from passband to stopband. Additionally, it would exhibit "linear" phase characteristics, meaning that the phase shift of an analog signal passing through the filter would increase linearly with linear increases in frequency.

In practice, however, the ideal low-pass filter can only be approximated. For example, the response characteristics of the ideal low-pass filter is often approximated by a ratio of two rational polynomials in the complex frequency domain, in which the highest power of the frequency term in the polynomials determines the "order" of the filter. Increasing the order of the filter generally improves the amplitude response characteristics at the expense of increasing the cost, complexity and number of stages needed to provide such characteristics.

A wide variety of polynomial functions have been employed in filter design. For example, Butterworth, Chebyshev, Legendre and Bessel filters are well-known and used extensively. None of these filters, however, substantially achieve the response characteristics of the ideal low-pass filter.

Such polynomial functions have also been employed in the design of high-pass filters. The ideal high-pass filter would exhibit a perfectly flat response in its passband (i.e., frequencies above $f_c$) and infinite attenuation in its stopband (i.e., frequencies below $f_c$), with a rapid transition from passband to stopband. Such an ideal filter also would exhibit linear phase characteristics, in which the phase shift of an analog signal passing through the filter would increase linearly with linear increases in frequency. However, the ideal high-pass filter also has not been achieved.

Such polynomial functions have also been employed in the design of bandpass filters. As is the case with low-pass and high-pass filters, the ideal bandpass filter has also not been achieved.

In view of the foregoing, it would be desirable to provide an efficient and low cost filter with improved frequency response characteristics, more particularly, improved gain selectivity, and substantially linear phase response characteristics.

It would also be desirable to provide such a filter that passes low frequency signals and attenuates higher frequency signals.

SUMMARY OF THE INVENTION

It is therefore an object of the present invention to provide an efficient and low cost filter with improved frequency response characteristics, more particularly, improved gain selectivity, and substantially linear phase response characteristics.

It is also an object of the present invention to provide such a filter that passes low frequency signals and attenuates higher frequency signals.

In accordance with these and other objects of the invention, a switched capacitor lowpass filter is disclosed having four cascaded general purpose switched capacitor active filter blocks that combine with each other to produce a particular overall transfer function that has high gain selectivity and substantially linear phase response characteristics. The filter can also include a clock input which allows a user to select the cut-off frequency of the filter. The filter's characteristics are tailored in accordance with a method which (1) introduces a notch frequency into the filter's gain characteristics, so as to improve the filter's gain selectivity near the cut-off frequency, and (2) linearizes the phase response characteristics of the overall filter, without modifying the magnitude of the gain of the notch-containing filter.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
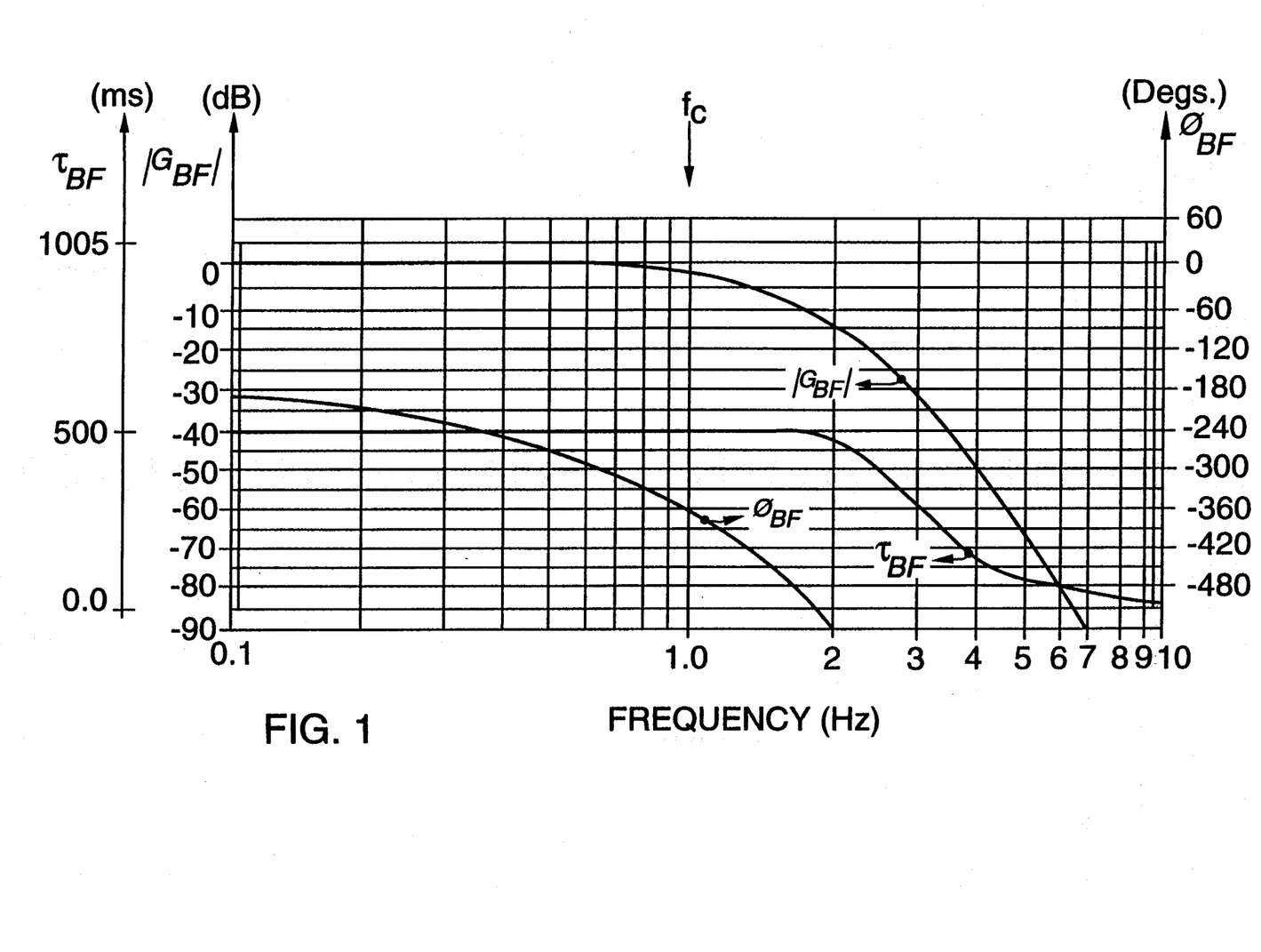
FIG. 1 shows the magnitude $|G_{BF}|$, phase $\phi_{BF}$ and group delay $\tau_{BF}$ of the gain characteristics versus frequency for a typical prior art low-pass filter having an eighth-order Bessel polynomial transfer function $G_{BF}(s)$.

FIG. 1 shows the magnitude $|G_{BF}|$, phase $\phi_{BF}$ and group delay $\tau_{BF}$ (i.e., the derivative of the phase $\phi_{BF}$ with respect to frequency f) of the gain characteristics versus frequency, f, for a typical prior art low-pass filter having an eighth-order Bessel polynomial transfer function $G_{BF}(s)$ represented by the equation:

$$G_{BF}(s) = \frac{v_{out}(s)}{v_{in}(s)} = \pi \prod_{m=1}^{4} \frac{(f_{0m})^2}{(s^2 + sf_{0m}/Q_m + (f_{0m})^2)}$$

where $s = i \cdot f$ (where i represents the complex number equal to the square root of negative one), and for:

m=1, $f_{01}=1.784 \cdot f_c$ and $Q_1=0.533$;
m=2, $f_{02}=1.838 \cdot f_c$ and $Q_2=0.560$;
m=3, $f_{03}=1.958 \cdot f_c$ and $Q_3=0.711$; and
m=4, $f_{04}=2.196 \cdot f_c$ and $Q_4=1.226$.

The filter response characteristics shown in FIG. 1 are plotted with a logarithm frequency scale and are normalized to have a cutoff frequency $f_c$ of 1 Hertz, with the magnitude $|G_{BF}|$ of the gain at $f_c$ being 3 dB down from the gain at low frequencies (i.e., less than 0.1 Hertz). Because the group delay $\tau_{BF}$ is constant below the cutoff frequency $f_c$, the Bessel function filter of FIG. 1 is said to have a "linear" phase relationship below the cut-off frequency $f_c$ (e.g., 1 Hertz). As further shown in FIG. 1, the phase $\phi_{BF}$ characteristics become highly non-linear (i.e., $\tau_{BF}$ is no longer constant) for frequencies above $2 \cdot f_c$ (e.g., 2 Hertz).

Although the Bessel function filter of FIG. 1 has linear phase characteristics below the cut-off frequency $f_c$, a disadvantage of the filter is that it has poor gain selectivity. In particular, the magnitude $|G_{BF}|$ of the gain rolls off slowly beyond the cutoff frequency $f_c$. For example, the magnitude $|G_{BF}|$ of the gain at $2 \cdot f_c$ is barely $-15$ dB, and at $4 \cdot f_c$ it is only $-52$ dB.

Figure 2:
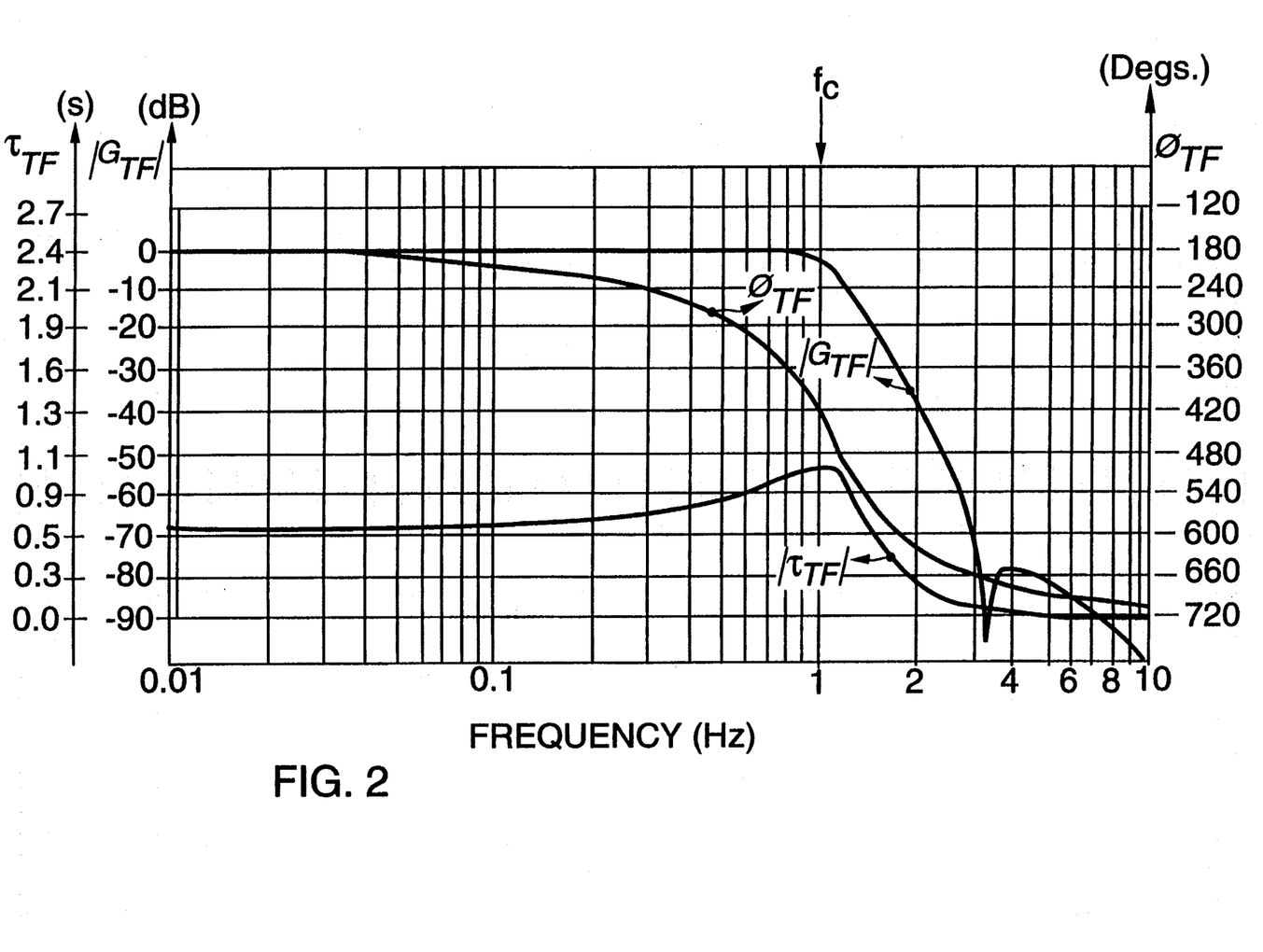
FIG. 2 shows the magnitude $|G_{TF}|$, phase $\phi_{TF}$ and group delay $\tau_{TF}$ of the gain characteristics versus frequency of a low-pass filter having a sixth-order polynomial transfer function $G_{TF}(s)$ in accordance with the present invention.

FIG. 2 shows the magnitude $|G_{TF}|$, phase $\phi_{TF}$ and group delay $\tau_{TF}$ of the gain characteristics versus frequency, f, for a low-pass filter having a sixth-order polynomial transfer function $G_{TF}(s)$ in accordance with one aspect of the present invention represented by the equation:

$$G_{TF}(s) = -(s^2 + (f_{n1})^2) \cdot (f_{02})^2 \cdot (f_{03})^2 \pi \prod_{m=1}^{3} \frac{1}{(s^2 + sf_{0m}/Q_m + (f_{0m})^2)}$$

where: $s = i \cdot f$ (where i represents the complex number equal to the square root of negative one);

$f_{n1} = 3.3166 \cdot f_c$;
$f_{01} = 0.7500 \cdot f_c$ and $Q_1 = 0.648$;
$f_{02} = 1.2202 \cdot f_c$ and $Q_2 = 1.3453$; and
$f_{03} = 1.1537 \cdot f_c$ and $Q_3 = 1.1896$.

Figure 3:
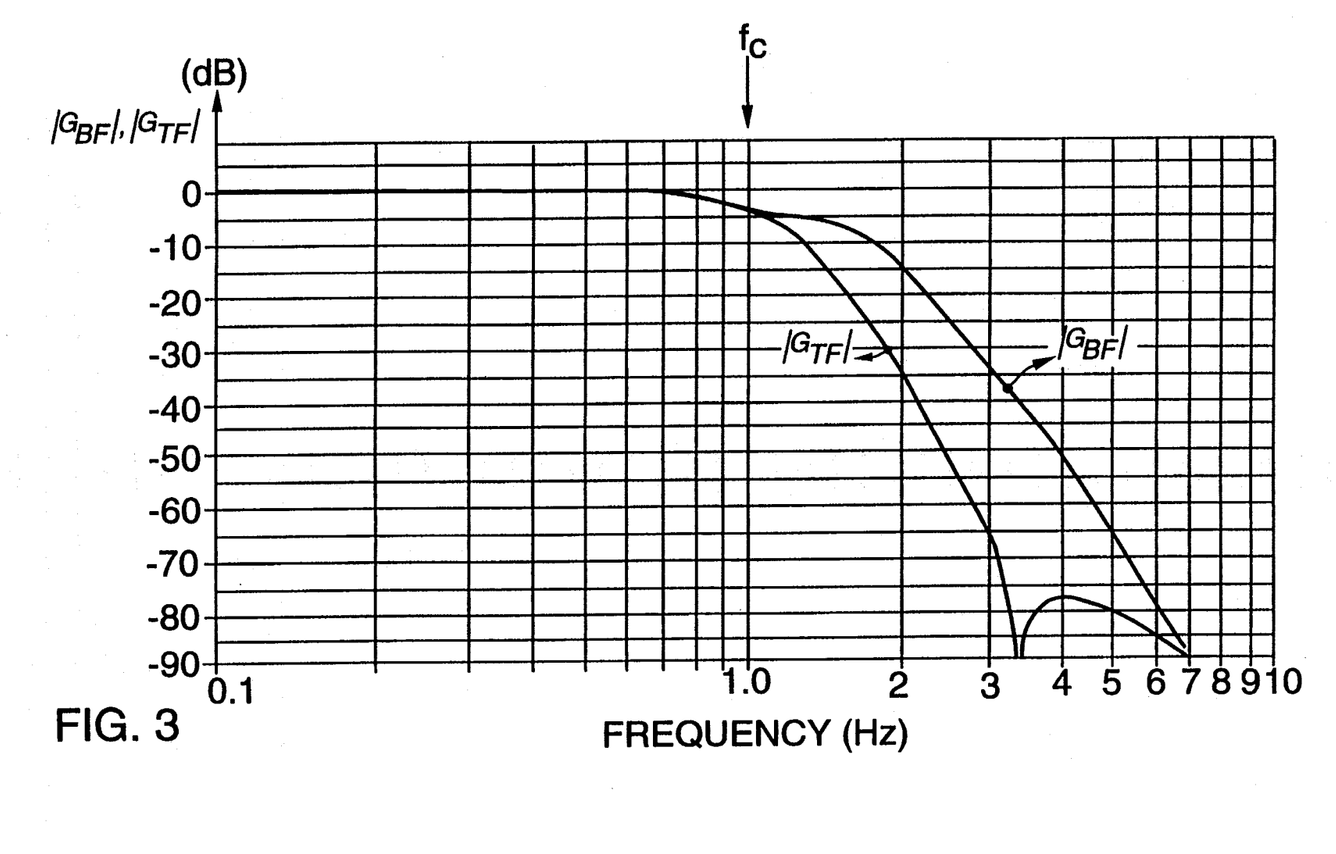
FIG. 3 compares the magnitudes $|G_{BF}|$ and $|G_{TF}|$ of the gain characteristics for the filters of FIGS. 1 and 2, respectively.

In comparison to the gain characteristics of the Bessel function filter shown in FIG. 1, the sixth-order filter of FIG. 2 (also plotted with a normalized cutoff frequency $f_c$ of 1 Hertz) is more selective. This feature of the present invention is illustrated in FIG. 3 in which the magnitudes $|G_{BF}|$ and $|G_{TF}|$ of the gain characteristics for the filters of FIGS. 1 and 2, respectively, are directly compared. As shown in FIG. 3, the attenuation of the filter of the present invention at $2 \cdot f_c$ (e.g., 2 Hertz) is more than 20 dB greater than the eighth-order Bessel function filter of FIG. 1, and more than 35 dB greater at $3 \cdot f_c$ (e.g., 3 Hertz).

The increased selectivity of the filter of the present invention is achieved because of the presence of a "notch factor" $(s^2 + (f_{n1})^2)$ in the transfer function $G_{TF}(s)$. At the notch frequency $f = f_{n1}$ (e.g., at 3.3166 Hertz in FIGS. 2 and 3), the notch factor goes to zero because $s^2 = -f_{n1}$. Thus, the transfer function $G_{TS}(s)$ goes to zero at the notch frequency and thus, $|G_{Tf}|$ approaches negative infinity in dB—resulting in a highly selective filter.

As used herein, a filter which includes a "notch frequency" in a stop band has the following dependance of transfer characteristics on frequency. As frequency increases towards the "notch frequency," the magnitude of the gain of the filter temporarily substantially decreases and approaches zero at the "notch frequency." As frequency still increases beyond the "notch frequency," the magnitude of the gain of the filter again returns to higher values. Thus, the derivative of the magnitude of the gain, as a function of frequency, changes sign (i.e., from positive to negative, or from negative to positive) as the frequency goes through the "notch frequency."

The above frequency dependance of the magnitude of the gain characteristics is achieved because of the presence of the term $s^2 + (f_{n1})^2$ incorporated into the transfer function. This feature of the present invention, in which a notch factor is used to improve the gain selectivity of a filter, is used in conjunction with a phase correction factor to tailor the group delay characteristics of the filter.

Although the group delay $\tau_{TS}$ of the filter of FIG. 2 is not constant for frequencies below the cut-off frequency $f_c$ (i.e., the phase $\phi_{TF}$ response characteristics are non-linear), a feature of the filter of FIG. 2 is that the phase $\phi_{TF}$ can be easily linearized in the pass band by employing a phase correction factor $G_{PCF}(s)$ having only a second order dependance upon frequency and represented by the equation:

$$G_{PCF}(s) = \frac{(s^2 - sf_{04}/Q_4 + (f_{04})^2)}{(s^2 + sf_{04}/Q_4 + (f_{04})^2)}.$$

As shown above, $G_{PCF}(s)$ includes only two complex poles (due to the denominator) and two complex zeros (due to the numerator) of phase correction.

Accordingly, a filter of the present invention incorporating the sixth-order polynomial transfer function $G_{TF}(s)$, in combination with the above second-order phase correction factor $G_{PCF}(s)$, will have an overall phase-corrected transfer function $G_{PCTF}(s)$ represented by the equation:

$$G_{PCTF}(s) = G_{TF}(s) \cdot G_{PCF}(s),$$

wherein $G_{TF}(s)$ and $G_{PCF}(s)$ are defined above.

Figure 4:
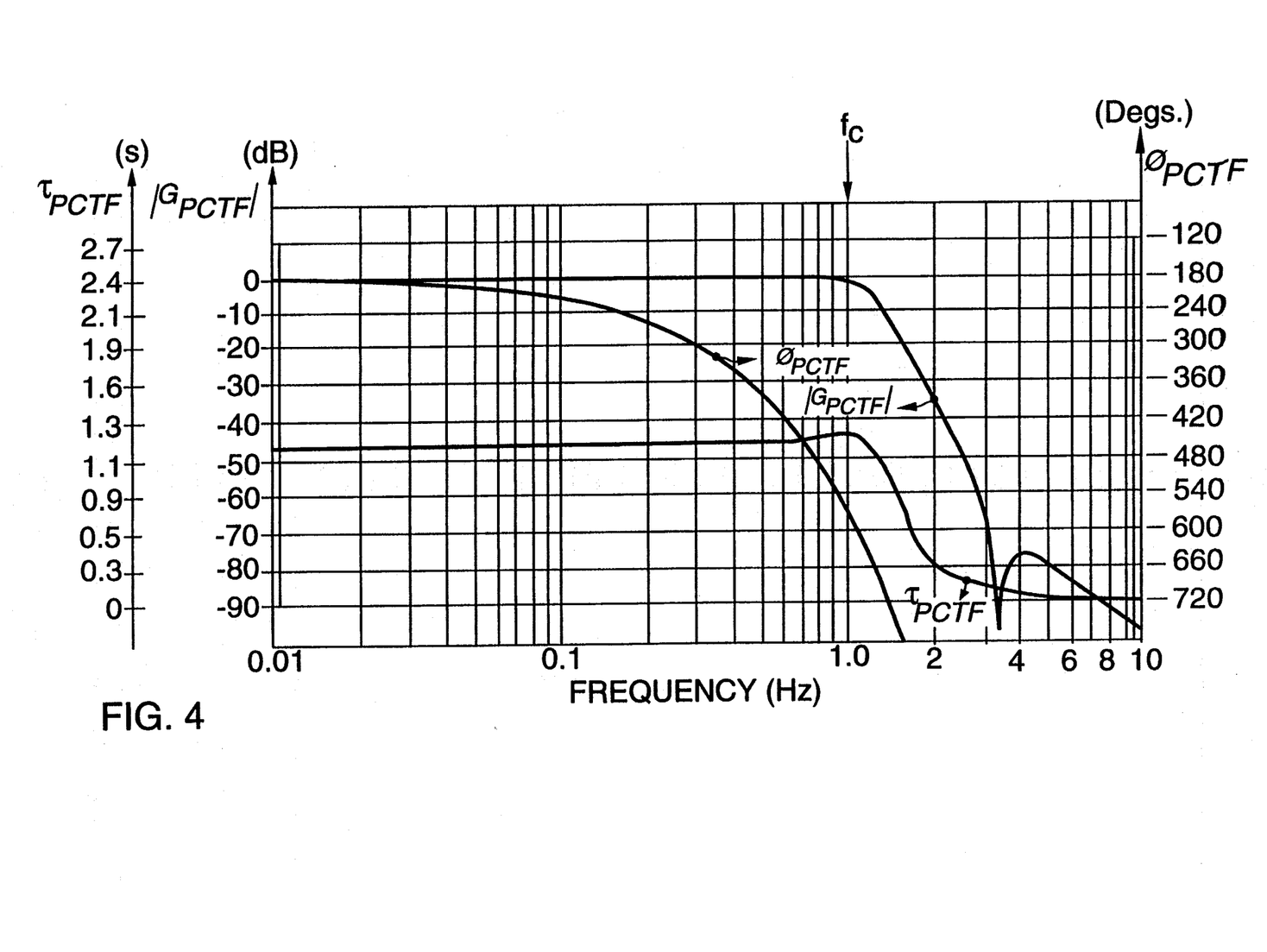
FIG. 4 shows the magnitude $|G_{PCTF}|$, phase $\phi_{PCTF}$ and group delay $\tau_{PCTF}$ of the gain characteristics versus frequency of a low-pass filter having a phase-corrected eight-order transfer function $G_{PCTF}(s)$ in accordance with the present invention.

FIG. 4 shows the magnitude $|G_{PCTF}|$, phase $\phi_{PCTF}$ and group delay $\tau_{PCTF}$ of the gain characteristics versus frequency, f, for a low-pass filter having the above phase-corrected transfer function (wherein $f_{04} = f_c$ and $Q_4 = 0.51$ for $G_{PCF}(s)$). As shown in FIG. 4, the gain $|G_{PCTF}|$ selectivity is not substantially altered by the introduction of the phase correction factor $G_{PCF}(s)$ into the gain characteristics. This is achieved because the magnitude of the transfer function $G_{PCF}(s)$ is approximately unity for the frequencies of interest in FIG. 4.

Thus, $G_{PCF}(s)$ corresponds to a transfer function of an "all-pass" filter.

Although the phase correction factor $G_{PCF}(s)$ does not modify the gain $|G_{PCTF}|$, it does have a desirable effect upon the phase $\phi_{PCTF}$ and group delay $\tau_{PCTF}$ of a filter incorporating such a phase correction factor. As shown in FIG. 4, the group delay $\tau_{PCTF}$ is substantially constant for frequencies below the cut-off frequency $f_c$.

Accordingly, a low-pass filter incorporating the sixth-order transfer function $G_{TF}(s)$ in combination with the phase correction factor $G_{PCF}(s)$ defined above, has magnitude characteristics which are more selective than an eighth-order Bessel function filter while maintaining a substantially linear phase relationship for frequencies below the cut-off frequency $f_c$. These features are achieved with a phase correction factor $G_{PCF}(s)$ which only has a second order dependance upon frequency. Thus, an efficient linear-phase filter having high gain selectivity can be achieved with reduced cost and complexity.

Figure 5:
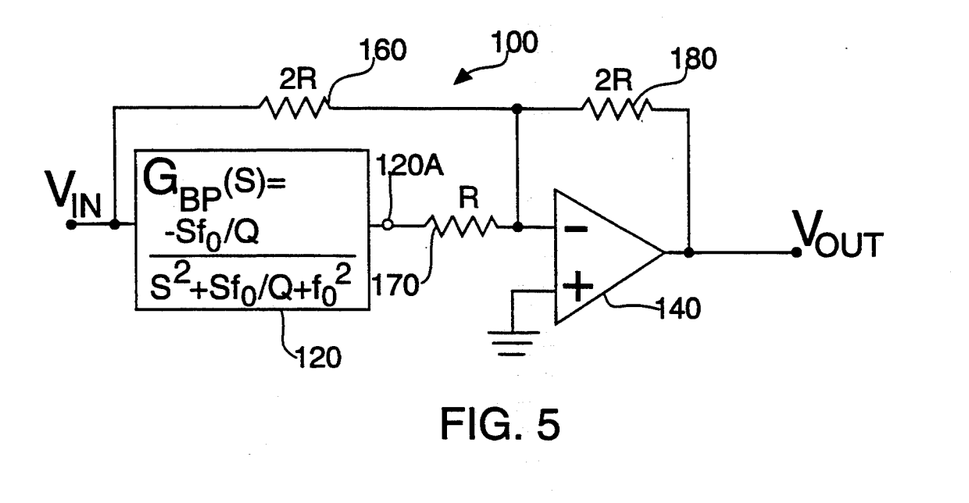
FIG. 5 is a schematic block and circuit diagram of an exemplary embodiment of a second-order all-pass circuit implementing a filter to linearize the phase response of the sixth-order polynomial $G_{TF}$ filter of the present invention.

FIG. 5 is a schematic circuit and block diagram of an exemplary embodiment of a circuit 100 implementing a filter for linearizing the phase response of a circuit implementing a sixth-order polynomial $G_{TS}$ filter having the transfer characteristics shown in FIG. 2. Circuit 100, which implements an all-pass function, includes second-order inverting band-pass filter 120 (having an associated transfer function $G_{BP}$), operational amplifier 140 and resistors 160, 170 and 180. Operational amplifier 140 sums (1) the input signal $v_{in}$, through resistor 160, with (2) twice the inverting band-pass filter 120 output, taken from terminal 120A.

As shown in FIG. 5, the second-order band-pass transfer function $G_{BP}$ of block 120 is represented by the equation:

$$G_{BP}(s) = \frac{-sf_0/Q}{(s^2 + sf_0/Q + (f_0)^2)},$$

where $f_0$ and Q are real constants. Accordingly, if resistors 160, 170 and 180 are chosen such that they have resistance values as shown in FIG. 5, the overall transfer function of the filter of FIG. 5 can be represented by the equation:

$$G_{AP}(s) = -\frac{v_{out}(s)}{v_{in}(s)} = \frac{(s^2 - sf_0/Q + (f_0)^2)}{(s^2 + sf_0/Q + (f_0)^2)}.$$

The transfer function $G_{AP}(s)$ is a ratio of two rational second order polynomials, each of which have a similar functional dependance upon the variable "s" as in the second-order phase correction factor $G_{PCF}(s)$ defined above. Thus, by proper selection of $f_0$ and Q in $G_{AP}(s)$, all-pass $G_{AP}$ filter 100 shown in FIG. 5 can be used to linearize the phase of the sixth-order transfer function $G_{TF}(S)$ of the present invention, without substantially modifying the magnitude of the gain $|G_{TF}|$.

Although exemplary all-pass $G_{AP}$ filter 100 shown in FIG. 5 includes operational amplifier 140, it will be apparent that this does not have to be the case. For example, all-pass $G_{AP}$ filter 100 could be composed of other active filter components (e.g., R-C active components, or switched capacitor components), or a network of resistors, capacitors and inductors, or combinations thereof, which provide a transfer function substantially like $G_{PCF}(s)$ as defined above.

Additionally, although exemplary all-pass $G_{AP}$ filter 100 in FIG. 5 performs a second-order all pass function, it will be apparent that this does not have to be the case. For example, filter 100 in the alternative could perform higher order all pass functions, for example, fourth, sixth or eighth-order all pass functions, as long as filter 100 linearizes the phase of the overall filter. These alternatives, however, can result in higher cost and complexity in comparison to the embodiment shown in FIG. 5.

Figure 6A:
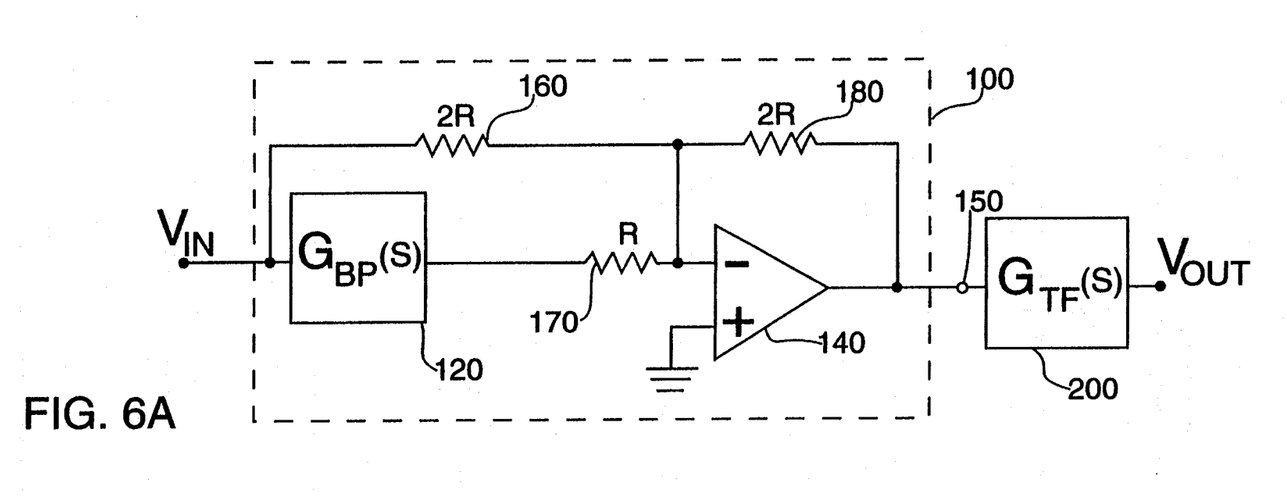
FIGS. 6A and 6B are schematic block and circuit diagrams of exemplary embodiments of a low-pass filter circuit constructed in accordance with the principles of the present invention.
Figure 6B:
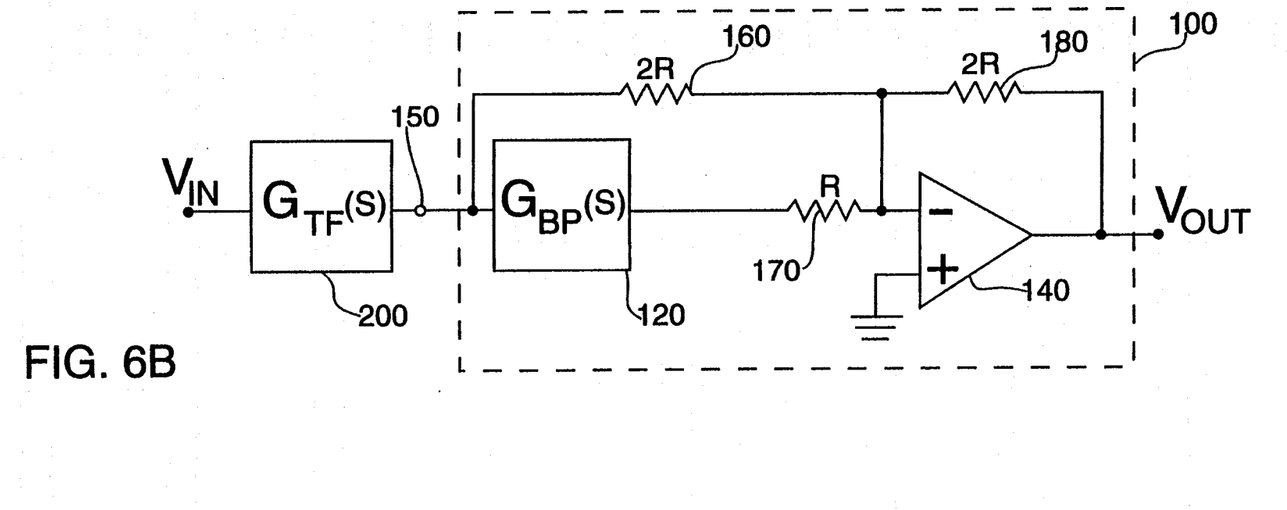

FIGS. 6A and 6B each show a schematic circuit and block diagram of an exemplary embodiment of a low-pass filter circuit constructed in accordance with the principles of the present invention. The filters in FIGS. 6A and 6B both include the exemplary all-pass filter circuit of FIG. 5 (to provide a transfer function substantially equivalent to $G_{PFC}(s)$ as defined above), cascaded with the sixth-order polynomial $G_{TF}$ filter of FIG. 2, to produce an eighth-order polynomial $G_{PCTF}$ low-pass filter having the gain characteristics of FIG. 4.

In FIG. 6A, the input signal $v_{in}$ is first coupled through all-pass $G_{AP}$ filter 100 prior to being coupled through sixth-order polynomial $G_{TF}$ filter 200 which has a transfer function $G_{TF}(s)$ as defined above. In contrast, for FIG. 6B, the input signal $v_{in}$ is first coupled through sixth-order polynomial $G_{TS}$ filter 200 prior to being coupled through all-pass $G_{AP}$ filter 100.

Thus, for the filters of FIGS. 6A and 6B, the phase of an analog signal passing through the filter is either corrected before or after passing through the low-pass section of the filter, respectively. However, for both filters, the overall filter transfer function is represented by the same function, $G_{PCTF}(s)$, as defined above.

As shown in FIGS. 6A and 6B, the coupling between all-pass $G_{AP}$ filter 100 and sixth-order polynomial $G_{TF}$ filter 200 is "serial" in which there is no overlap in components between respective filters 100 and 200 (i.e., filters 100 and 200 only share common terminal 150). Thus, for the present embodiment, all-pass $G_{AP}$ filter 100 is discrete and separated from sixth-order polynomial $G_{TF}$ filter 200. As will be discussed below, this does not have to be the case.

As for all-pass $G_{AP}$ filter 100, filter 200 can also consist of either active filter components (e.g., R-C active components or switched capacitor components), or a network of resistors, capacitors and inductors, or combinations thereof, which provide a transfer function substantially equivalent to $G_{TF}(s)$, as defined above.

Figure 7:
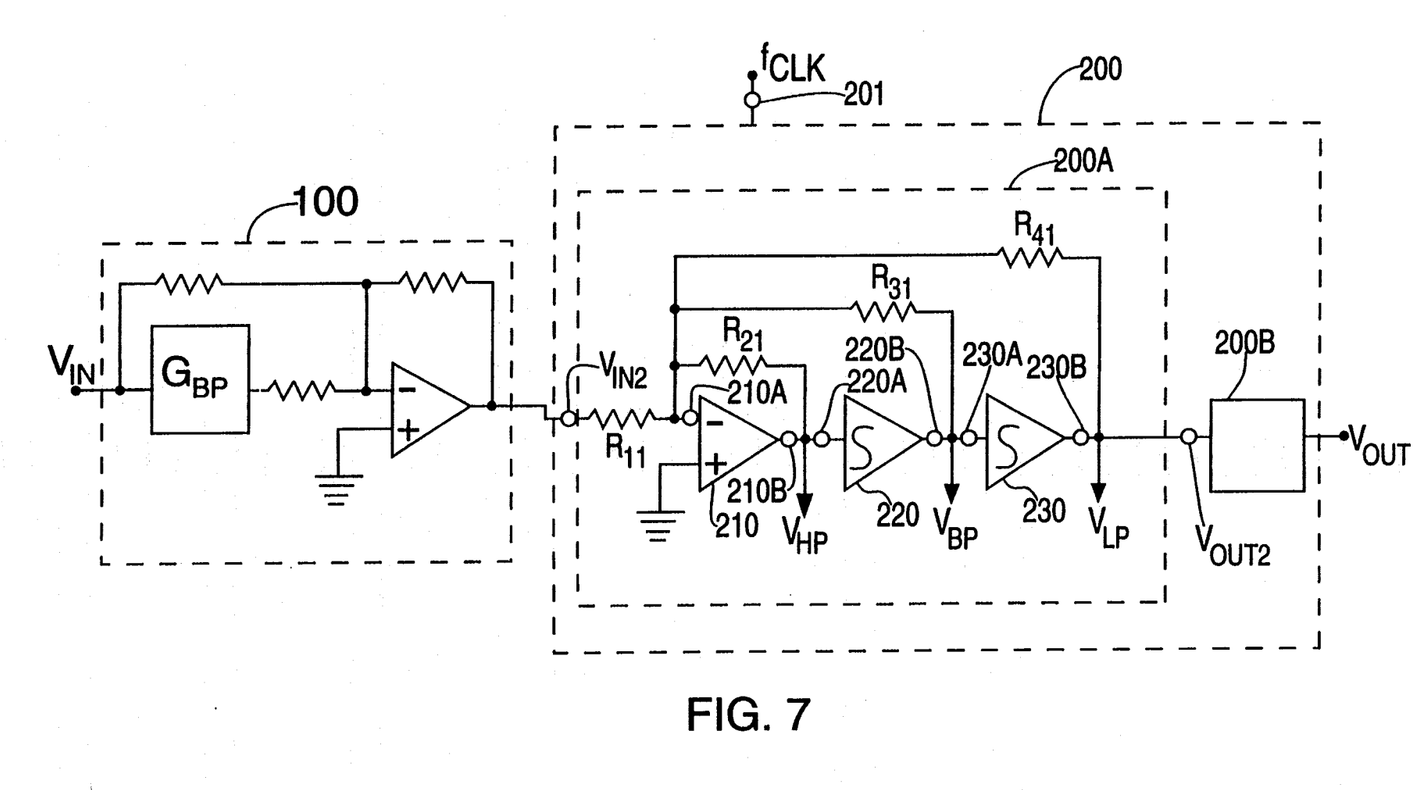
FIG. 7 is a more detailed schematic block and circuit diagram of an embodiment of the exemplary circuit of FIG. 6A.

In accordance with the present invention, it is preferred that the filters shown in FIGS. 6A and 6B are constructed using cascaded general purpose switched capacitor filters (also referred to as "universal filters") having a clock input which allows the cut-off frequency $f_c$ to be adjusted by the user. This aspect of the present invention is illustrated by FIG. 7 in which an embodiment of sixth-order polynomial $G_{TF}$ filter 200 of FIG. 6A is shown in greater detail. As shown in FIG. 7, filter 200 includes second-order section 200A cascaded with fourth-order section 200B, which combine to produce a filter having the transfer function $G_{TF}(s)$ of the present invention. Clock input 201 is used to allow the user to select the 3 dB cut-off frequency $f_c$ of the filter.

In FIG. 7, second-order section 200A is constructed using a conventional general purpose switched capacitor active filter including operational amplifier 210 and integrators 220 and 230 (preferably both being operational amplifiers configured as integrators). The input signal $v_{in2}$ to second-order section 200A is coupled (through resistor $R_{11}$) to amplifier 210, the output of which is coupled to input terminal 220A of integrator 220. The output 220B of integrator 220 is coupled to the input 230A of integrator 230.

Generally, resistors $R_{11}$, $R_{21}$, $R_{31}$ and $R_{41}$ are chosen to provide the coefficients of a particular second-order transfer function. For a general purpose switched capacitor active filter, high pass $v_{HP}(s)$, band pass $v_{BP}(s)$ and low pass $v_{LP}(s)$ functions are available at terminals 210B, 220B and 230B, respectively. However, for the present embodiment which is a low-pass filter, second-order section 200A is used to provide a low pass function, and thus, low pass terminal 230B is coupled to the input of fourth-order section 200B. Accordingly, the transfer function $G_{LP}(s)$ of second-order section 200A can be represented by the equation:

$$G_{LP}(s) = \frac{v_{out2}(s)}{v_{in2}(s)} = -\frac{R_{41}}{R_{11}} \cdot \frac{(f_{01})^2}{(s^2 + sf_{01}/Q_{LP} + (f_{01})^2)},$$

where $s = i \cdot f$ (where $i$ represents the complex number equal to the square root of negative one) and:
$f_{01} = (R_{21}/R_{41})^{\frac{1}{2}}/(2\pi T)$;
$T$ = the time constant of integrators 220 and 230; and
$Q_{LP} = (R_{31}/R_{21}) \cdot (R_{21}/R_{41})^{\frac{1}{2}}$.

Although not specifically shown in FIG. 7, fourth-order section 200B can also include cascaded second-order sections similar to section 200A (wherein the resistance values would be chosen accordingly).

In accordance with the present invention, with the filter constructed using cascaded general purpose switched capacitor active filters, clock input 201 is adapted to be coupled to an external TTL or CMOS clock that tunes the cut-off frequency $f_c$ of the filter. Accordingly, the clock to cut-off frequency ratio is preferably either about 50 or about 100.

Because all-pass $G_{AP}$ filter 100 and sixth-order polynomial $G_{TF}$ filter 200 are cascaded in series without overlap between respective filter blocks, the overall filter of FIG. 7 will generally require thirteen operational amplifiers when constructed out of general purpose switched capacitor active filters (i.e., fourth-order section 200B will generally require six additional operational amplifiers for a total of nine for sixth-order polynomial $G_{TF}$ filter 20, and all-pass $G_{AP}$ filter 100 would generally require four).

In an alternate particularly preferred embodiment of the present invention, the functions of all-pass $G_{AP}$ filter 100 and sixth-order polynomial $G_{TF}$ filter 200 are integrated so that these filter blocks can share operational amplifiers. As a result, the total number of operational amplifiers needed for the overall eight-order phase-corrected transfer function $G_{PCTF}(s)$ can be reduced so as to reduce the cost and simplify the design of the filter of the present invention.

Figure 8:
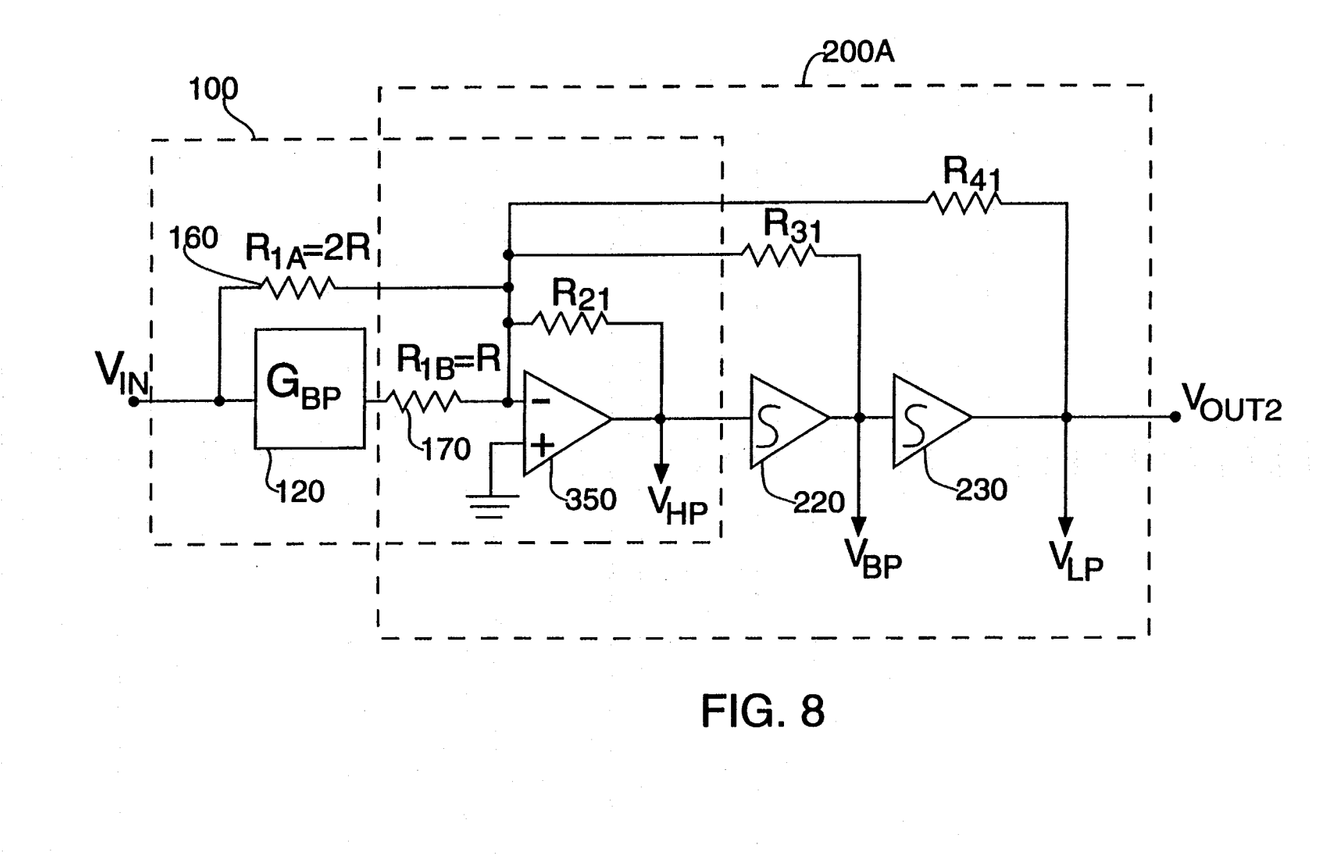
FIG. 8 is a detailed schematic block and circuit diagram of an alternate embodiment of a low-pass filter circuit constructed in accordance with the principles of the present invention.

This feature is illustrated in FIG. 8 in which second-order all-pass $G_{AP}$ filter 100 of FIG. 7 is integrated with section 200A of sixth-order polynomial $G_{TF}$ filter 200 of FIG. 7. As shown in FIG. 8, operational amplifier 350 is "shared" by both all-pass $G_{AP}$ filter 100 and section 200A so that the total number of operational amplifiers in the overall filter is reduced by one.

The transfer function $G_{PCLP}(s)$ of the combination of filter 100 and section 200A shown in FIG. 8 (i.e., $v_{out2}/v_{in}$) is still obtained by multiplying the transfer function of the phase correction factor $G_{PCF}(s)$, corresponding to all-pass $G_{AP}$ filter 100, by the transfer function $G_{LP}(s)$ of section 200A. Thus, if resistors 160 and 170 are chosen to have the resistance values as shown in FIG. 8 (i.e., $R_{1A}/R_{1B} = 2$), the transfer function $G_{PCLP}(s)$ can be represented by the equation:

$$G_{PCLP}(s) = \frac{v_{out2}(s)}{v_{in}(s)} = -\frac{R_{41}}{R_{1A}} \cdot$$

$$\frac{(f_{01})^2}{(s^2 + sf_{01}/Q_{LP} + (f_{01})^2)} \cdot \frac{(s^2 - sf_0/Q + (f_0)^2)}{(s^2 + sf_0/Q + (f_0)^2)}$$

where: $s = i \cdot f$ (where $i$ represents the complex number equal to the square root of negative one) and:
$f_{01} = (R_{21}/R_{41})^{\frac{1}{2}} \cdot (2\pi T)^{-1}$;
$T$ = the time constant of integrators 220 and 230;
$Q_{LP} = (R_{31}/R_{21}) \cdot (R_{21}/R_{41})^{\frac{1}{2}}$; and
$Q$ and $f_0$ are defined as in FIG. 5 above.

Accordingly, the filter of FIG. 8, although having the same overall transfer function as that of FIG. 7, can be constructed out of one less operational amplifier. Thus, the filter of FIG. 8 can be constructed at lower cost and with a simpler design in comparison to the filter of FIG. 7.

Figure 9:
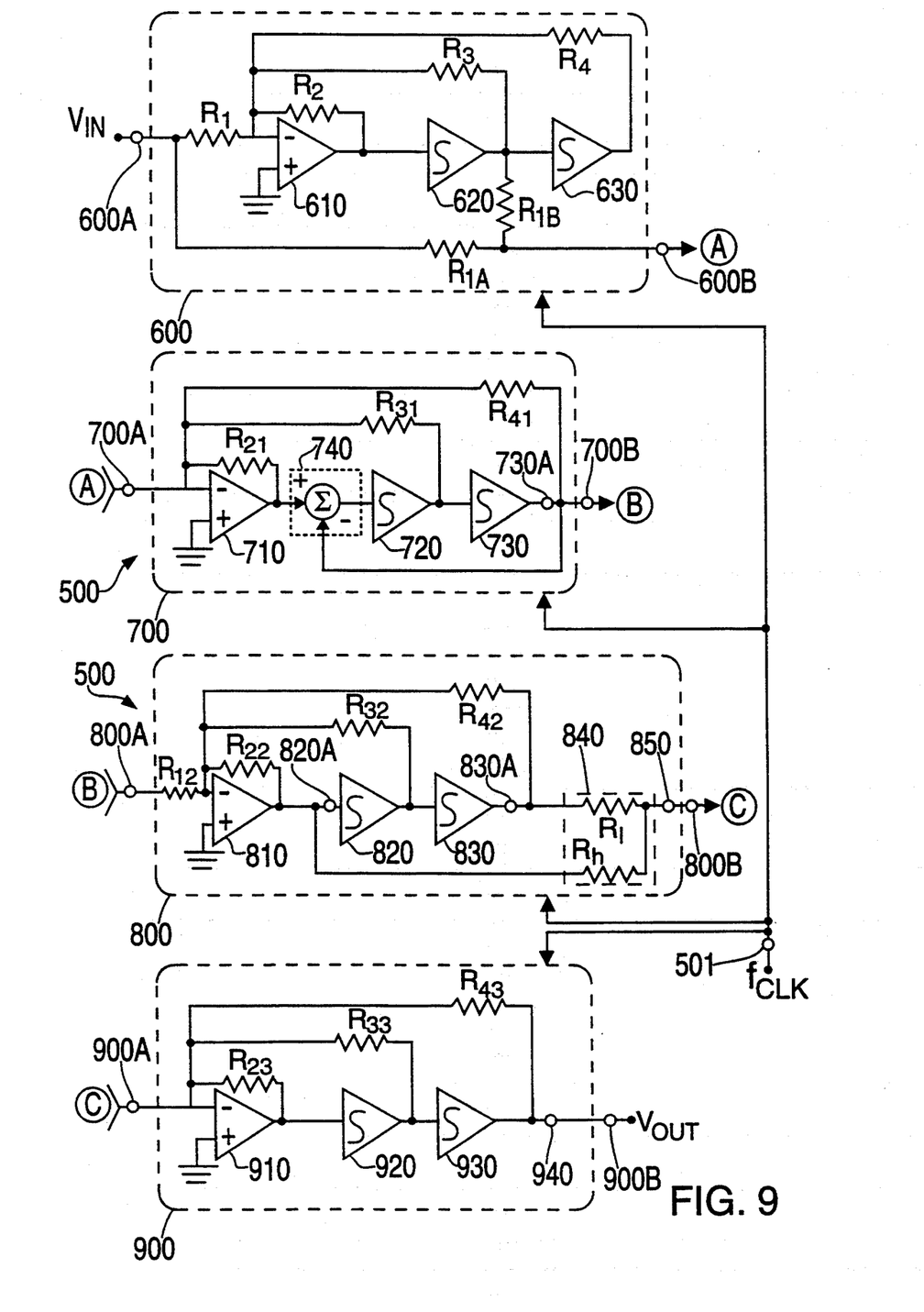
FIG. 9 is a detailed schematic block and circuit diagram of a preferred embodiment of the filter of FIG. 7.

FIG. 9 shows a more detailed schematic circuit and block diagram of a preferred embodiment of the filter of FIG. 8. As shown in FIG. 9, filter 500 includes sections 600, 700, 800 and 900 cascaded in series to produce an overall transfer function $G_{OTF}(s)$ that can be represented by the equation:

$$G_{OTF}(s) = \frac{v_{out}(s)}{v_{in}(s)} =$$

$$-\frac{R_{23}}{R_h} \frac{R_{42}}{R_{12}} \frac{(R_{21}/R_{1A})}{(1 + R_{21}/R_{41})} \frac{(s^2 - sf_{04}/Q_4 + f_0^2)}{(s^2 + sf_{04}/Q_4 + f_0^2)} \frac{f_{01}^2}{(s^2 + sf_{01}/Q_1 + f_{01}^2)} \frac{f_{02}^2}{(s^2 + sf_{02}/Q_2 + f_{02}^2)} \frac{(s^2 + f_n^2)}{(s^2 + sf_{03}/Q_3 + f_{03}^2)}$$

where: $s = i \cdot f$ (where $i$ represents the complex number equal to the square root of negative one), $R_{1A}/R_{1B} = 2$, $R_1 = R_3$ and:
$f_{01} = [1 + (R_{21}/R_{41})]^{\frac{1}{2}} \cdot (f_c)$;
$Q_1 = (R_{31}/R_{21}) \cdot [1 + (R_{21}/R_{41})]^{\frac{1}{2}}$;
$f_{02} = (R_{22}/R_{42})^{\frac{1}{2}} \cdot (f_c)$;
$Q_2 = (R_{32}/R_{22}) \cdot (R_{22}/R_{42})^{\frac{1}{2}}$;
$f_{03} = (R_{23}/R_{43})^{\frac{1}{2}} \cdot (f_c)$;
$Q_3 = (R_{33}/R_{23}) \cdot (R_{23}/R_{43})^{\frac{1}{2}}$;
$f_{04} = (R_2/R_4)^{\frac{1}{2}} \cdot (f_c)$;
$Q_4 = (R_3/R_2) \cdot (R_2/R_4)^{\frac{1}{2}}$; and $f_n = (R_h/R_l)^{\frac{1}{2}} \cdot (f_c)$.

In accordance with the preferred embodiment of the present invention, filter 500 is constructed out of general purpose switched capacitor active filters which are driven by a clock at a frequency $f_{CLK}$ defined by the equation $f_{CLK} = M \cdot f_c$ where the above parameters are chosen to have the following values:
$f_{01} = 1.22 \cdot (f_{CLK}/M)$ and $Q_1 = 1.34$;
$f_{02} = 0.75 \cdot (f_{CLK}/M)$ and $Q_2 = 0.648$;
$f_{03} = 1.1537 \cdot (f_{CLK}/M)$ and $Q_3 = 1.1896$;
$f_{04} = 1.0 \cdot (f_{CLK}/M)$ and $Q_4 = 0.51$; and
$f_{n1} = 3.3166 \cdot (f_{CLK}/M)$.

Thus, filter 500 shown in FIG. 9 has a cutoff frequency $f_c$ set by the clock frequency $f_{CLK}$ selected by the user at clock input 501. Accordingly, a user is able to select a cutoff frequency $f_c$ in a range, for example if M=50, from about 1 Hz to about 250 kHz, by employing a clock signal having a frequency from about 50 Hz to about 12.5 MHz, respectively.

Referring to FIG. 9, section 600, in conjunction with operational amplifier 710 of section 700, provides phase linearization similar to all-pass $G_{AP}$ filter 100 in FIG. 8. Second-order sections 700, 800 and 900 combine to provide the sixth-order $G_{TF}$ transfer function of the present invention similar to sections 200A and 200B of FIG. 7. Sections 600, 700, 800 and 900 consists of general purpose switched capacitor active filters.

Second-order section 700 includes optional summer 740 which provides negative feedback of the signal at output 730A of integrator 730. The use of summer 740 allows a center frequency of 1.22·($f_{CLK}$/M) to be achieved for section 700 with reduced sensitivity on the ratio $R_{21}$ to $R_{41}$ (note that $f_{01}$ depends upon the square root of $[1+R_{21}/R_{41}]$ and not simply the square root of $[R_{21}/R_{41}]$). It would be apparent to those of skill in the art that section 900 could, if desired, also include such a summer (because the center frequencies $f_{0m}$'s of those sections are greater than the 3 dB cut-off frequency).

Resistor network 840 (including resistors $R_l$ and $R_h$) provides for the notch frequency $f_{n1}$ required by the transfer function $G_{TF}(s)$. These resistors sum the high-pass pass function output 820A with the low-pass function output 830A into the next section 900A, thus forming a notch.

Although FIG. 9 shows that section 800 provides for the notch frequency $f_{n1}$, through resistor network 840, this does not have to be the case. For example, section 700 could include resistor network 840 instead. The same is true for section 900, except for this particular alternative embodiment, section 900 would, of course, have to include an additional operational amplifier cascaded with output terminal 900B of section 900, wherein the resistor network would be cascaded between output terminal 900B and the additional operational amplifier input.

As shown in FIG. 9, sections 600, 700, 800 and 900 are cascaded in series. Thus, output terminal 600B of section 600 is coupled to input terminal 700A of section 700, output terminal 700B of section 700 is coupled to input terminal 800A of section 800, and output terminal 800B of section 800 is coupled to input terminal 900A of section 900. However, it would be apparent that other cascade configurations for the filter of FIG. 9 can be used to provide the same transfer function $G_{PCLP}(s)$ defined above.

Thus, either (1) both sections 800 and 900 can be cascaded in front of sections 600 and 700, or (2) either section 800 or section 900 can be cascaded in front of sections 600 and 700 with the other section still cascaded after sections 600 and 700, without altering the transfer function of the filter.

Another feature of the filter shown in FIG. 9 is that it can be implemented monolithically into a single integrated circuit. Because it employs only 12 operational amplifiers, instead of 13, it uses less semiconductor wafer area and consumes less power than would otherwise be required. Additionally, because the filter is monolithically integrated, it can be manufactured at less cost and can be more reliable than a filter constructed from discrete components.

Although the present invention has been discussed above with reference to FIGS. 2–9 in the context of a particular low pass filter having particular transfer functions $G_{TF}(s)$ to increase gain selectivity and $G_{PCF}(s)$ to linearize phase, the invention can also be used to improve the gain selectivity and phase characteristics of other filters.

The overall transfer function of the filter of the present invention can be represented generally by the following equation:

$$G(s)=(s^2+f_{notch}^2) \cdot G_{GAIN}(s) \cdot G_{\phi AP}(s),$$

where: (a) the term $(s^2+f_{notch}^2)$ is the notch factor of the present invention which improves gain selectivity; (b) the term $G_{GAIN}(s)$ is a transfer function which combines with the notch factor $(s^2+f_{notch}^2)$ to provide the magnitude of the gain of the overall filter (e.g., for the filter of FIG. 4, $G_{GAIN}(s)=G_{TS}(s)/(s^2+f_{n1}^2)$; and (c) term $G_{\phi AP}(s)$ is the transfer function of the present invention which improves phase linearity (e.g., $G_{PCF}(s)$ for the filter of FIG. 4). Using this generalized equation, a filter's gain selectivity and phase linearity can be improved by carrying out the following method.

To improve a filter in accordance with the invention, a filter's gain selectivity is first modified by placing a notch frequency, represented by the factor $(s^2+f_{notch}^2)$ adjacent the cut-off frequency $f_c$ in the stopband of the filter. The notch factor $f_{notch}$, is chosen: (1) so that the gain of the overall filter $G(s)$ substantially approaches zero in a finite frequency range in the stopband of the filter, and (2) so that the selectivity of the filter is improved in the transition frequency region between the stop band and pass band of the filter.

Thus, for a low-pass filter, $f_{notch}$ is placed in the stopband at a frequency greater than the cut-off frequency $f_c$. For a high-pass filter, $f_{notch}$ is placed in the stopband at a frequency less than the cut-off frequency $f_c$. For a band-pass filter, $f_{notch}$ is similarly placed in a stopband either above or below a transition region depending upon which transition region corresponding gain selectivity it is desired to improve.

After the gain selectivity is improved, the phase linearity is then modified by incorporating an all-pass phase linearization factor, represented by the term $G_{\phi AP}(s)$, into the filter having a combined transfer function represented by the equation $(S^2+f_{notch}^2) \cdot G_{GAIN}(s)$. Thus, the phase of an analog signal passing through the filter is modified without substantially modifying the magnitude of the gain. In accordance with the present invention, $G_{\phi AP}(s)$ can be a single second-order all-pass transfer function (as is the case for $G_{PCF}(s)$ discussed above), or in the alternative, a product of two or more second-order all-pass transfer functions. Although the latter alternative would increase the cost and complexity of the filter in comparison to the embodiments shown in FIGS. 5–9.

After the above steps are carried out, a filter having an overall transfer function represented by the equation $G(s)=G_{GAIN}(s) \cdot (s^2+f_{notch}^2) \cdot G_{\phi AP}(s)$ is obtained. The obtained filter will have improved gain selectivity and phase linearity. Additionally, when the filter is monolithically integrated into a single semiconductor integrated circuit, the filter can be manufactured at less cost and can be more reliable than a filter constructed from discrete components.

As discussed above, the addition of the notch term to the overall filter transfer function modifies the frequency response characteristics so as to improve the gain selectivity in the transition frequency region. If desired, $G_{GAIN}(s)$ can be pre-chosen so that it combines with the notch factor to produce a desired frequency response characteristic. For example, $G_{GAIN}(s)$ can be pre-chosen to include particular features in its transfer function which anticipate the addition of the notch factor to the overall filter transfer function. Thus, $G_{GAIN}(s)$ can be selectively chosen to include a peak in its gain characteristics in a region adjacent the cut-off frequency in its pass band. When combined with the notch factor, the peak is used to produce an overall magnitude response that is more particularly flat in the pass band than would otherwise be achieved without the selective addition of the peak. As a result, the filter of the present invention can have enhanced gain roll-off (i.e., gain selectivity) combined with other desirable frequency response characteristics, by appropriate selection of the starting transfer function $G_{GAIN}(s)$.

As indicated above, the method of the present invention can be used with other types of transfer functions, in addition to those that perform low-pass functions, in which gain selectivity and phase linearity are important considerations. Thus, in accordance with the present invention G(s) can perform a high-pass or band-pass function, in which the notch factor $(s^2 + f_{NOTCH}^2)$ is placed in a stopband and where the term $G_{\phi AP}(s)$ improves the phase linearity in the pass band.

One skilled in the art will thus appreciate that the present invention can be practiced by other than the described embodiments, which are presented for purposes of illustration and not of limitation, and the present invention is limited only by the claims which follow.

What is claimed is:

1. A monolithically integrated filter circuit having an input for receiving an analog input signal $V_{in}$ and having an output for producing a filtered analog output signal $V_{out}$, wherein said filter circuit has a gain, defined by the ratio of $V_{out}$ to $V_{in}$, having a magnitude and a phase dependent upon frequency f, said filter circuit comprising:

a first active circuit coupled between said input and output for providing said magnitude, such that the magnitude as a function of frequency includes a pass band in a first frequency range, a stop band in a second frequency range, and a 3 dB cut-off frequency in a transition region therebetween, said first active circuit causing said magnitude to have a notch, at a notch frequency in the stop band, for improving gain selectivity of the filter circuit in the transition region; and a second active circuit coupled between said input and output for adjusting the phase to reduce nonlinearity in the change in phase as a function of frequency in the pass band, without substantially changing the magnitude.

2. The filter circuit of claim 1 wherein the first and second active circuits are switched capacitor circuits.

3. The filter circuit of claim 2 wherein the filter circuit includes an input for receiving a clock signal having a clock frequency, said clock frequency controlling the 3 dB cut-off frequency so that the 3 dB cut-off frequency can be varied within a third frequency range.

4. The filter circuit of claim 3 wherein said filter circuit comprises a plurality of general purpose switched capacitor active filters cascaded in series so that each active filter performs a second-order filtering function.

5. The filter circuit of claim 4 wherein said general purpose switched capacitor active filters each comprise an operational amplifier, a first integrator and a second integrator cascaded in series.

6. The filter circuit of claim 5 wherein the first frequency range is below the second frequency range so that said filter circuit passes low frequencies and stops high frequencies.

7. The filter circuit of claim 5 wherein the first frequency range is above the second frequency range so that said filter circuit passes high frequencies and stops low frequencies.

8. The filter circuit of claim 1 wherein the first and second active circuits are R-C active circuits.

9. The filter circuit of claim 8 wherein the first frequency range is below the second frequency range so that said filter circuit passes low frequencies and stops high frequencies.

10. The filter circuit of claim 8 wherein the first frequency range is above the second frequency range so that said filter circuit passes high frequencies and stops low frequencies.

11. A monolithically integrated filter circuit having an input for receiving an analog input signal $v_{in}$ and having an output for producing a filtered analog output signal $v_{out}$, wherein said filter circuit has a gain, defined by the ratio of $v_{out}$ to $v_{in}$, having a magnitude and a phase dependent upon frequency f, said filter circuit further comprising:

first, second, third and fourth switched capacitor circuits cascaded in series, each respective switched capacitor circuit in turn having an operational amplifier, a first integrator and a second integrator cascaded in series so as to provide high pass, band pass and low pass functions at the respective outputs of said operational amplifier, first integrator and second integrator, wherein:

three of said four switched capacitor circuits provide said magnitude, such that the magnitude as a function of frequency includes a pass band in a first frequency range, a stop band in a second frequency range and a 3 dB cut-off frequency in a transition region therebetween, said three switched capacitor circuits causing said magnitude to have a notch, at a notch frequency in the stop band, for improving the gain selectivity of the filter circuit in the transition region and said notch being provided by at least one of said three switched capacitor circuits including a plurality of notch-providing resistors; and said remaining one switched capacitor circuit having a plurality of resistors for adjusting the phase, so that the change in phase as a function of frequency is substantially constant in the pass band, without substantially changing the magnitude.

12. The filter circuit of claim 11 wherein the filter circuit includes an input for receiving a clock signal having a clock frequency, said clock frequency controlling the 3 dB cut-off frequency so that the 3 dB cut-off frequency can be varied within a fourth frequency range.

13. The filter circuit of claim 12 wherein said filter circuit comprises a plurality of general purpose switched capacitor active filters cascaded in series so that each active filter performs a second-order filtering function.

14. The filter circuit of claim 13 wherein the first frequency range is below the second frequency range so that said filter circuit passes low frequencies and stops high frequencies.

15. The filter circuit of claim 13 wherein the first frequency range is above the second frequency range so that said filter circuit passes high frequencies and stops low frequencies.

16. A filter circuit having an input for receiving an analog input signal $v_{in}$ and having an output for producing a filtered analog output signal $v_{out}$, wherein said filter circuit has a gain, defined by the ratio of $v_{out}$ to $V_{in}$, having a magnitude and a phase dependent upon frequency f, said filter circuit comprising:

a switched capacitor gain circuit coupled between said input and output for providing said magnitude, such that the magnitude as a function of frequency includes a pass band in a first frequency range, a stop band in a second frequency range, and a 3 dB cut-off frequency $f_c$ in a transition region therebetween, said gain circuit causing said gain to substantially conform to the following frequency-dependent low pass function:

$$-(s^2 + (f_{n1})^2) \cdot (f_{02})^2 \cdot (f_{03})^2 \; \pi \prod_{m=1}^{3} \frac{1}{(s^2 + sf_{0m}/Q_m + (f_{0m})^2)}$$

wherein $f_{n1}$, $f_{01}$, $Q_1$, $f_{02}$, $Q_2$, $f_{03}$, and $Q_3$ are real constants and $s = i \cdot f$, where i represents a complex number equal to the square root of negative one; and an input for receiving a clock signal having a clock frequency, said clock frequency controlling the 3 dB cut-off frequency so that the 3 dB cut-off frequency can be varied within a third frequency range;

said filter circuit being further characterized in that it comprises a plurality of general purpose switched capacitor active filters cascaded in series, each active filter performing a second order filtering function.

17. The circuit of claim 16 wherein:
$f_{02}$ is less than $f_c$; and
$f_{01}$ and $f_{03}$ are greater than $f_c$.

18. The circuit of claim 17 wherein:
$Q_2$ is less than one; and
$Q_1$ and $Q_3$ are greater than one.

19. The circuit of claim 18 wherein $f_{n1}$ is greater than $f_c$ and less than $4 \cdot f_c$.

20. The circuit of claim 19 wherein $f_{01}$ and $f_{03}$ are less than $1.5 \cdot f_c$.

21. The filter circuit of claim 16 wherein said general purpose switched capacitor active filters each comprise an operational amplifier, a first integrator and a second integrator cascaded in series.

22. A filter circuit having an input for receiving an analog input signal $V_{in}$ and having an output for producing a filtered analog output signal $v_{out}$, wherein said filter circuit has a gain, defined by the ratio of $v_{out}$ to $V_{in}$, having a magnitude and a phase dependent upon frequency f, said filter circuit comprising:

a first circuit coupled between said input and output for providing said magnitude, such that the magnitude as a function of frequency includes a pass band in a first frequency range, a stop band in a second frequency range, and a 3 dB cut-off frequency $f_c$ in a transition region therebetween, said first circuit causing said gain to substantially conform to the following frequency-dependent low pass function:

$$-(s^2 + (f_{n1})^2) \cdot (f_{02})^2 \cdot (f_{03})^2 \; \pi \prod_{m=1}^{3} \frac{1}{(s^2 + sf_{0m}/Q_m + (f_{0m})^2)}$$

wherein $f_{n1}$, $f_{01}$, $Q_1$, $f_{02}$, $Q_2$, $f_{03}$, and $Q_3$ are real constants and $s = i \cdot f$, where i represents a complex number equal to the square root of negative one; and a second circuit coupled between said input and output for adjusting the phase to reduce non-linearity in the change in phase as a function of frequency in the pass band, without substantially changing the magnitude, and wherein the second circuit adjusts the phase substantially according to the following function:

$$\frac{(s^2 - sf_{04}/Q_4 + (f_{04})^2)}{(s^2 + sf_{04}/Q_4 + (f_{04})^2)}$$

wherein $f_{04}$ and $Q_4$ are real constants and $s = i \cdot f$, where i represents the complex number equal to the square root of negative one.

23. The circuit of claim 22 wherein:
$f_{02}$ is less than $f_c$; and
$f_{01}$ and $f_{03}$ are greater than $f_c$.

24. The circuit of claim 23 wherein:
$Q_2$ is less than one; and
$Q_1$ and $Q_3$ are greater than one, 25. The circuit of claim 24 wherein $f_{n1}$ is greater than $f_c$ and less than $4 \cdot f_c$.

26. The circuit of claim 25 wherein $f_{01}$ and $f_{03}$ are less than $1.5 \cdot f_c$.

27. The filter circuit of claim 22 wherein the first and second circuits are switched capacitor circuits.

28. The filter circuit of claim 27 wherein the filter circuit includes an input for receiving a clock signal having a clock frequency, said clock frequency controlling the 3 dB cut-off frequency so that the 3 dB cut-off frequency can be varied within a third frequency range.

29. The filter circuit of claim 30 wherein said filter circuit comprises a plurality of general purpose switched capacitor active filters cascaded in series so that each active filter performs a second-order filtering function.

30. The filter circuit of claim 29 wherein said general purpose switched capacitor active filters each comprise an operational amplifier, a first integrator and a second integrator cascaded in series.

31. The filter circuit of claim 29 wherein said general purpose switched capacitor active filters are monolithically integrated into a single semiconductor integrated circuit.

32. The circuit of claim 31 wherein the second circuit includes a second circuit input and a second circuit output and further includes:

a band-pass filter circuit having a band-pass input coupled to the second circuit input and a band-pass output; and an operational amplifier having an amplifier input coupled to the band-pass output and an amplifier output coupled to the second circuit output.

33. The circuit of claim 32 wherein:
a first resistor is coupled between the band-pass output and the amplifier input;
a second resistor is coupled between the amplifier input and amplifier output; and a third resistor is coupled between the amplifier input and the band-pass input.

34. The circuit of claim 33 wherein the second and third resistors have resistance values approximately two times that of the first resistor.

35. A monolithically integrated filter circuit having an input for receiving an analog input signal $v_{in}$ and having an output for producing a filtered analog output signal $v_{out}$, wherein said filter circuit has a gain, defined by the ratio of $v_{out}$ to $v_{in}$, having a magnitude and a phase dependent upon frequency f, said filter circuit comprising:

a first means coupled between said input and output for providing said magnitude, such that the magnitude as a function of frequency includes a pass band in a first frequency range, a stop band in a second frequency range and a 3 dB cut-off frequency in a transition region therebetween, said first means causing said magnitude to have a notch, at a notch frequency in the stop band, for improving gain selectivity of the filter circuit in the transition region; and a second means coupled between said input and output in series with said first means, said second means for adjusting the phase to reduce non-linearity in the change in phase as a function of frequency in the pass band, without substantially changing the magnitude.

36. The filter circuit of claim 35 wherein the first and second means are switched capacitor circuits.

37. The filter circuit of claim 36 wherein the filter circuit includes an input for receiving a clock signal having a clock frequency, said clock frequency controlling the 3 dB cut-off frequency so that the 3 dB cut-off frequency can be varied within a fourth frequency range.

38. The filter circuit of claim 37 wherein said filter circuit comprises a plurality of general purpose switched capacitor active filters cascaded in series so that each active filter performs a second-order filtering function.

39. The filter circuit of claim 38 wherein said general purpose switched capacitor active filters each comprise an operational amplifier, a first integrator and a second integrator cascaded in series.

40. The filter circuit of claim 39 wherein the first frequency range is below the second frequency range so that said filter circuit passes low frequencies and stops high frequencies.

41. The filter circuit of claim 39 wherein the first frequency range is above the second frequency range so that said filter circuit passes high frequencies and stops low frequencies.

42. The filter circuit of claim 35 wherein the first and second means are R-C active circuits.

43. The filter circuit of claim 42 wherein the first frequency range is below the second frequency range so that said filter circuit passes low frequencies and stops high frequencies.

44. The filter circuit of claim 42 wherein the first frequency range is above the second frequency range so that said filter circuit passes high frequencies and stops low frequencies.

45. A monolithically integrated filter circuit having an input for receiving an analog input signal $v_{in}$ and having an output for producing a filtered analog output signal $v_{out}$, wherein said filter circuit has a gain, defined by the ratio of $v_{out}$ to $v_{in}$, having a magnitude and a phase dependent upon frequency f, said filter circuit further comprising:

first, second, third and fourth means cascaded in series, each respective means in turn having an operational amplifier, a first integrator and a second integrator cascaded in series so as to provide high pass, band pass and low pass functions at the respective outputs of said operational amplifier, first integrator and second integrator, wherein:

three of said four means provide said magnitude, such that the magnitude as a function of frequency includes a pass band in a first frequency range, a stop band in a second frequency range and a 3 dB cut-off frequency in a transition region therebetween, said three means causing said magnitude to have a notch, at a notch frequency in the stop band, for improving the gain selectivity of the filter circuit in the transition region and said notch being provided by at least one of said three means including a plurality of notch-providing resistors; and said remaining one means having a plurality of resistors for adjusting the phase, so that the change in phase as a function of frequency is substantially constant in the pass band, without substantially changing the magnitude.

46. The filter circuit of claim 45 wherein the filter circuit includes an input for receiving a clock signal having a clock frequency, said clock frequency controlling the 3 dB cut-off frequency so that the 3 dB cut-off frequency can be varied within a fourth frequency range.

47. The filter circuit of claim 46 wherein said first, second, third and fourth means each perform a second-order filtering function.

48. The filter circuit of claim 47 wherein the first frequency range is below the second frequency range so that said filter circuit passes low frequencies and stops high frequencies.

49. The filter circuit of claim 47 wherein the first frequency range is above the second frequency range so that said filter circuit passes high frequencies and stops low frequencies.

50. The filter circuit of claim 1 wherein the first and second active circuits are coupled in series.

51. The filter circuit of claim 22 wherein the first and second circuits are coupled in series.

* * * * *

UNITED STATES PATENT AND TRADEMARK OFFICE
CERTIFICATE OF CORRECTION

PATENT NO. : 5,440,270
DATED : August 8, 1995
INVENTOR(S) : Nello G. Sevastopoulos and Philip T. Karantzalis It is certified that error appears in the above-indentified patent and that said Letters Patent is hereby corrected as shown below:

<u>Column</u>   <u>Line</u>

Cover Page Item [56],
| Column | Line | |
|---|---|---|
| 2 | 2 | Change "Halt" to -- Holt --. |
| 8 | 41 | Change "$f^2_{01}$" to -- $f_{01}^2$ --. |
| 8 | 41 | Change "$f^2_{02}$" to -- $f_{02}^2$ --. |
| 13 | 11 | Change "$V_{in}$" to -- $v_{in}$ --. |
| 14 | 29 | Change "one," to -- one. --. |
| 14 | 42 | Change "30" to -- 28 --. |

Signed and Sealed this

Thirty-first Day of August, 1999

Attest:

Q. TODD DICKINSON

*Attesting Officer*     *Acting Commissioner of Patents and Trademarks*